United States Patent

[11] 3,621,465

[72] Inventor Charles A. Beaty
Tampa, Fla.
[21] Appl. No. 862,542
[22] Filed May 19, 1969
[45] Patented Nov. 16, 1971
[73] Assignee RFD, Inc.
Tampa, Fla.
Original application July 22, 1968, Ser. No. 746,492, now Patent No. 3,500,398, dated Mar. 10, 1970.

[54] SUPERREGENERATIVE AMPLIFIER OSCILLATOR WITH TUNNEL DIODE
2 Claims, 9 Drawing Figs.

[52] U.S. Cl. ........................................ 331/107 T, 307/322, 331/173
[51] Int. Cl. ........................................ H03b 7/08
[50] Field of Search ........................................ 331/107; 307/322, 287; 325/105; 332/16

[56] References Cited
UNITED STATES PATENTS

| | | | |
|---|---|---|---|
| 2,986,724 | 5/1961 | Jaeger | 331/107 |
| 3,500,244 | 3/1970 | Gleeson | 307/322 |

*Primary Examiner*—John Kominski
*Attorney*—Sughrue, Rothwell, Mion, Zinn & Macpeak

ABSTRACT: A superregenerative amplifier/oscillator having a tunnel diode as the negative resistance device, operates in the linear mode in response to a quench pulse. The tunnel diode is biased at the valley point of its forward voltage characteristic curve. The quench pulse overcomes the bias and places the tunnel diode on the negative resistance slope of its characteristic curve thereby allowing buildup of oscillations in the superregenerative amplifier/oscillator. Automatic gain control is provided by sampling the superregenerative amplifier/oscillator output in response to maximum signal input, and controlling the width of the quench pulse in accordance with the amplitude of the superregenerative amplifier/oscillator output.

INVENTOR
CHARLES A. BEATY

BY Sughrue, Rothwell, Mion, Zinn & Macpeak
ATTORNEYS

SUPERREGENERATIVE AMPLIFIER OSCILLATOR WITH TUNNEL DIODE

RELATED CASES

The present case is a divisional application of application, Ser. No. 746,492 filed July 22, 1968 for Radio Altimeter by Charles A. Beaty, and now U.S. Pat. No. 3,500,398 issued Mar. 10, 1970.

BACKGROUND OF THE INVENTION

1. Field of the Invention

The present invention is in the field of superregenerative amplifier/oscillators and in particular superregenerative amplifier/osciallators as used in radar ranging devices.

2. Prior Art

The usual superregenerative device includes an oscillator which is controlled to assume alternately an oscillating and a nonoscillating condition at a low frequency rate under the control of a quench pulse. With proper adjustment, oscillation will build up in a superregenerative device during the duration of the quench pulse and these oscillations will die out when the quench pulse is removed.

In the absence of a signal input to the superregenerative device, the oscillation which build up during the existence of the quench signal commence with an initial amplitude determined by the thermal noise voltages in the input circuit of the device, and these oscillations reach a final value determined by the width of the quench signal. These oscillations then die out during the absence of the quench pulse. For proper operation of the superregenerative device as a radar-type receiver, the oscillations must decay to an amplitude less than the input circuit thermal noise before the oscillating condition of the oscillator is again restored by the next quench pulse. When a received signal voltage is applied to the input of the superregenerative device, and when the received signal is larger in magnitude than the thermal noise in the tuned circuit of the superregenerative device, then, when the oscillations start to build up in response to the quench pulse, their initial amplitude corresponds to the amplitude of the superimposed received signal rather than to the smaller amplitude thermal noise signal in the input circuit. The oscillations, therefore, reach a larger amplitude than before because of the larger initial amplitude. The action of the received signal is accordingly to increase the height and width and thus the average area under the envelope of the oscillations which are produced by the superregenerative device by an amount which becomes greater as the amplitude of the received signal becomes larger. The superregenerative principle, as described above, provides a simple means for obtaining a large amount of radiofrequency amplification at frequencies which are difficult to amplify by other means.

There are generally two modes of operation for superregenerative devices under control of quench pulses. These are the linear mode and the logarithmic mode. The linear mode results when the width of the quench pulse is sufficiently short so that the oscillations do not have time to build up to full saturation amplitude. The logarithmic mode results when the quench pulse width is sufficiently long to allow oscillations to build up to the saturation amplitude. The superregenerative device to be described herein will be assumed to be operating in a linear mode.

Superregenerative devices have been found to be very useful in radar ranging devices. They have definite advantages over the superheterodyne radar systems in that ranging at much shorter distances is possible. This advantage lies in the fact that the superregenerative device listens for only a small fraction of the duration of the quench pulse, while the superheterodyne detector listens for the entire duration of a corresponding gating pulse. The reason for this is that the sensing interval of the superregenerative oscillator is of extremely short duration occuring just at the start of the buildup of oscillations. In one known type of range tracking device, the output amplitude of the superregenerative device is a measure of the degree of coincidence of the quench pulse and the received echo pulse. Any deviation in the amplitude output indicates a change in the target range and this deviation is used to control the time of occurrence of the quench pulse. Although such range tracking radars have made use of superregenerative devices in the past, namely triode cavity oscillators, only fair sensitivity is obtainable with the best triodes currently available in the microwave frequency bands.

SUMMARY OF THE

The present invention comprises a superregenerative device having a tunnel diode as the negative resistance superregenerative for controlling oscillation. The tunnel diode is normally biased at the valley point of its voltage-current characteristic curve thereby providing a very high impedance to the resonant circuit of the superregenerative device. In response to a quench pulse, the operating point of the tunnel diode is moved to the negative slope region of the current/voltage characteristic curve, placing the tunnel diode in the negative resistance region and causing the necessary condition for oscillation buildup in the resonant circuit of the superregenerative device. As an example of the improved sensitivity obtained by using a tunnel diode superregenerative device, at 4.3 gc. the tunnel diode regenerative device provides about 20 db. better sensitivity than a triode superregenerative device. This means that for a given radar system, the transmitter power may be reduced by the same factor (100 times), providing a considerable cost savings in transmitter, transmitter modulator and transmit-receive duplexer.

The tunnel diode superregenerative amplifier also provides sensitivity comparable with that of a superheterodyne receiver, while eliminating the requirement of a local oscillator, mixer, and intermediate frequency amplifier and additionally eliminating the time delay uncertainty associated with superheterodyne receivers.

Automatic gain control for the superregenerative device is provided by periodically controlling the time of occurrence of the quench pulse so that it occurs during the maximum amplitude of the received signal. The output of the superregenerative amplifier thereby varies in accordance with the amplitude of the received signal, and this output is used to modulate the width of the quench pulse.

DETAILED DESCRIPTION OF THE DRAWINGS

Figure 1:
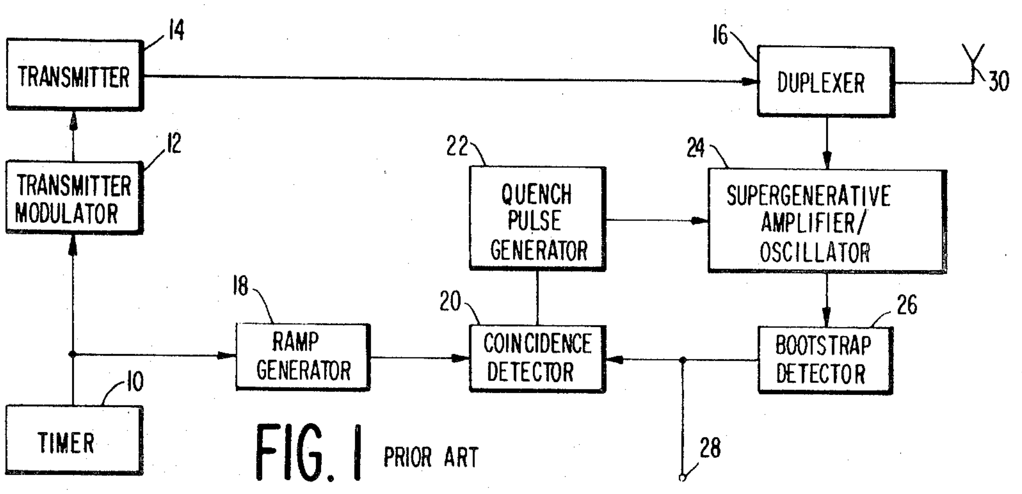
FIG. 1 PRIOR ART
FIG. 1 is a block diagram of a prior art range tracking device using a superregenerative amplifier/oscillator.

The prior art radar ranging system of FIG. 1 includes a timer 10, transmitter modulator 12, transmitter 14, duplexer 16, antenna 30, superregenerative amplifier/oscillator 24, bootstrap detector 26, quench pulse generator 22, ramp generator 18 and coincidence detector 20. The timer 10 provides output pulses at specified intervals. The timer output pulses control the time at which pulses are transmitted. These pulses are applied to a transmitter modulator 12 whose output is connected to the transmitter 14. The output pulses from transmitter 14 pass through a duplexer 16 to the antenna 30. The timer output pulses also trigger a ramp generator 18 which generates a voltage ramp whose amplitude represents the distance traveled by the transmitted pulse. The echo pulse received from the target by antenna 30 is applied through duplexer 16 to the signal input terminal of superregenerative amplifier/oscillator 24. The output of superregenerative amplifier/oscillator 24 is applied to a bootstrap detector 26, also known as a boxcar detector, whose output voltage amplitude represents the range of the target. The range may be detected at output terminal 28. The output voltage of bootstrap detector 26 is compared with the output of ramp generator 18 in coincidence detector 20. The coincidence detector 20 provides an output trigger pulse when the ramp generator output voltage reaches the level of the bootstrap detector output voltage. The trigger pulse from the coincidence detector triggers a quench pulse generator 22 which generates a quench pulse that is applied to the superregenerative amplifier/oscillator 24.

The bootstrap detector 26 includes a capacitor which is charged negatively by the output of the superregenerative device 24. The amount of negative charge depends upon the magnitude of the superregenerative device output. In between outputs, there is a controlled leakdown of the negative charge on the capacitor in the bootstrap detector causing the output therefrom to become more positive. The bootstrap detector 26, quench pulse generator 22, and superregenerative device 24 are adjusted so that the amount of negative charge which leaks off the capacitor during the interpulse period is exactly compensated by the next superregenerative device output, provided the target has not moved further out in range or closer in range. By this adjustment, the leading edge of the quench pulse is placed somewhere along the leading edge of the received echo signal causing the receiver output to have the proper amplitude to compensate for the leakdown of the charge on the bootstrap detector capacitor.

The position of the leading edge of the quench pulse with respect to the leading edge of the echo determines the initial amplitude of the oscillation buildup within the resonant circuit of the superregenerative device 24, and thereby also determines the output envelope magnitude. If the target does not change range, the leading edge of the quench pulse is positioned relative to the leading edge of the echo such that the output envelope magnitude exactly compensates for the controlled voltage leakdown of the bootstrap detector 26 during the interpulse period.

If the target moves closer in during the interpulse period, the quench pulse moves further up the leading edge of the echo signal resulting in a larger amplitude output from the superregenerative device 24. This lowers the output of the bootstrap detector 26, indicating a shorter range to the target. The lower output from bootstrap detector 26 also causes coincidence detector 20 to provide a trigger output which will advance the time of occurrence of the next quench pulse thereby adjusting the degree of coincidence of the quench pulse and the received echo. If the target moves further out during the interpulse period, the opposite is true causing the output of the superregenerative device 24 to be lowered in amplitude. Thus, the output of bootstrap detector 26 increases, indicating a larger range to the target and retarding the time of occurrence of the next quench pulse.

From the above discussion, it becomes apparent that there are two necessary features in a superregenerative amplifier/oscillator used in range tracking devices. A response of the superregenerative device to the quench pulse must be rapid and there must be some form of automatic gain control. Automatic gain control is necessary because the output amplitude of the superregenerative device should be a measure of the coincidence of the quench pulse and received echo pulse. In order to make this output independent of the echo pulse strength, it is necessary to provide automatic gain control.

Figures 2, 4A, 4B, 5:
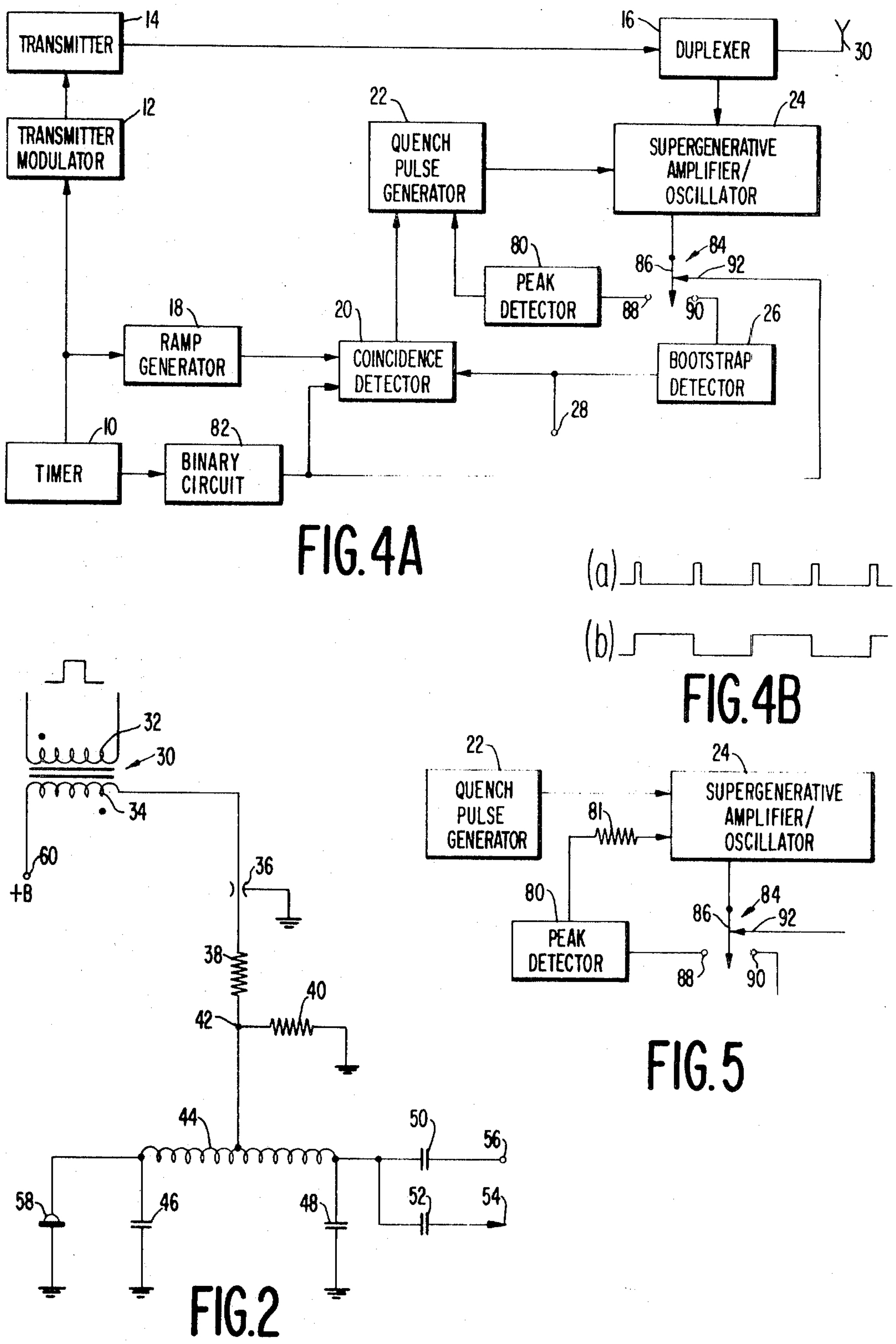
FIG. 2 is a circuit diagram of a tunnel diode superregenerative amplifier/oscillator in accordance with the present invention.
FIG. 4A is a block diagram of a system for providing automatic gain control of the superregenerative amplifier/oscillator in accordance with the present invention.
FIG. 4B illustrates certain waveforms which occur at different parts of the circuit of FIG. 4A.
FIG. 5 is a block diagram of a modification of FIG. 4A.

FIG. 2 shows a circuit diagram of a preferred embodiment of a tunnel diode superregenerative amplifier/oscillator in accordance with the present invention. The superregenerative device comprises a resonant circuit including inductance 44 and capacitors 46 and 48. The inductance 44 may be a coil, or a section of a transmission line or any type of inductor which will provide the necessary inductance for the resonant circuit. A tunnel diode 58 is connected to the resonant circuit and is biased initially by a biasing voltage source +B at terminal 60. The signal input to the superregenerative device is at terminal 56 and is fed to the resonant circuit by a coupling capacitor 50. The output oscillations appear at output terminal 54 and are coupled thereto via an output coupling capacitor 52. The quench pulses are applied the device by a pulse transformer 30 comprising primary winding 32 and secondary winding 34. Also included in the device are a feed through capacitor 36, and a voltage divider comprising resistors 38 and 40.

Figure 3A:
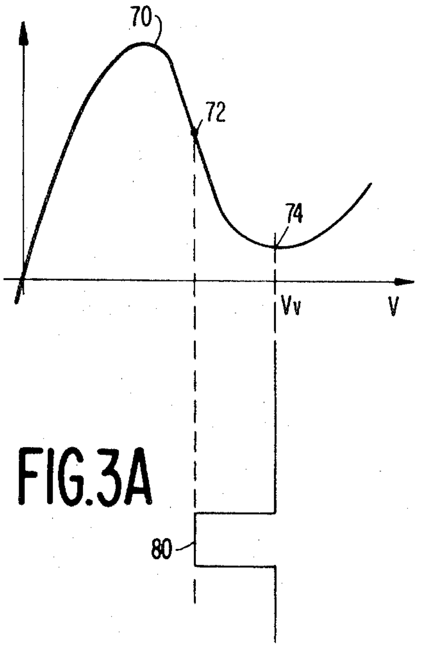
FIGS. 3A through 3D illustrate the method of biasing the tunnel diode of FIG. 2.

In order for the device of FIG. 2 to be used as a superregenerative device, it is necessary that the tunnel diode 58 be biased as indicated in FIG. 3A. Curve 70 represents a typical current versus voltage characteristic of a tunnel diode. During the quiescent period, the tunnel diode 58 is biased at the valley point 74 of its forward voltage characteristic curve which has a resistance slope of infinity and thus causes no disturbance of the circuit to which it is connected. Consequently, the condition necessary for the buildup of oscillations in the resonant circuit is not present.

Referring back to FIG. 2, the bias voltage at terminal 60 and the resistors 38 and 40 are adjusted so that the voltage at terminal 42 is equal to the voltage required to bias tunnel diode 58 at the valley point 74 of its forward voltage characteristic curve. When the quench pulse is received via transformer 30, the voltage at terminal 42 is decreased by an amount sufficient to move the operating point of the tunnel diode 58 to approximately point 72 on the forward voltage characteristic curve 70. Under this latter condition, the tunnel diode 58 presents a negative resistance to the resonant circuit thereby providing the necessary condition for the buildup of oscillations in the resonant circuit.

Figure 3C:
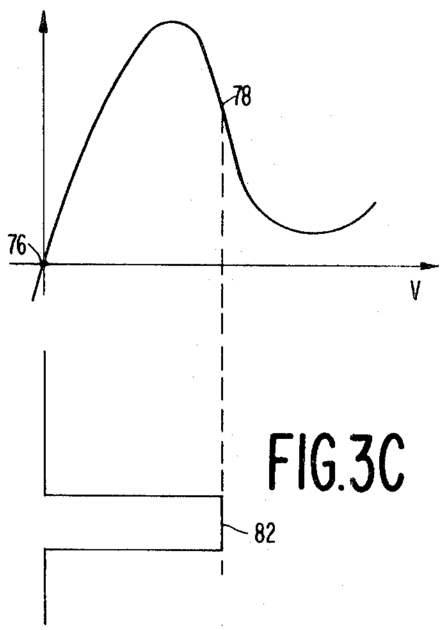
Figure 3B:
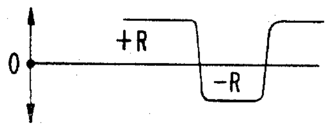

FIG. 3B shows a graph of the circuit resistance versus time when the circuit is biased, as indicated in FIG. 3A. During the absence of the quench pulse, the circuit has a positive resistance and when the quench pulse is applied the circuit has a negative resistance.

Figure 3D:
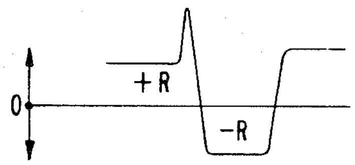

FIG. 3C illustrates why operation of the tunnel diode at a quiescent bias of zero as would ordinarily be assumed, is unsatisfactory. If the tunnel diode were ordinarily biased at the 0 voltage point 76 of the forward voltage characteristic curve, in response to the quench pulse, the operating point must traverse a region of high positive slope along the characteristic curve to get to point 78 on the negative resistance slope. As indicated in FIG. 3D, which is the same type of representation as shown in FIG. 3B, the transversal of the high positive resistance at the critical period during the beginning of the quench pulse strongly damps the resonant circuit of the superregenerative device causing a large decrease in sensitivity. Thus, it is apparent from FIGS. 3A through 3D that it is necessary to bias the tunnel diode during the quiescent period at the valley point of the forward voltage characteristic curve. Pulses 80 and 82 in FIGS. 3A and 3C, respectively, represent the quench pulses necessary for moving the bias point to the middle of the negative slope region of the forward voltage characteristic curves.

Referring back to FIG. 2, the purpose of capacitor 36, which may be a conventional feed through capacitor, is to provide decoupling of the radiofrequency signals. That is, the capacitor 36 prevents the radiofrequencies from going out to the bias terminal but allows the quench pulse to come through to the tunnel diode 58. The purpose of shunt resistor 40 is to prevent the device from operating as a relaxation oscillator. The impedance looking back toward the bias source from terminal 42 must be lower than the absolute value of the impedance of the tunnel diode 58 when it is in the negative resistance region. If it is otherwise, the circuit will operate as a relaxation oscillator. The shunt resistance 40 is selected to provide a total impedance looking back from terminal 42 which is lower than the absolute value of the negative impedance of diode 58.

One system for controlling the gain of the superregenerative device in a radar ranging system such as that shown in FIG. 1, is illustrated in block diagram form in FIG. 4, wherein the blocks identified by the same numerals in FIGS. 1 and 4 represent substantially the same elements. Since the width of the quench pulse determines the amplitude the superregenerative oscillations are allowed to attain, and since the gain of the superregenerative device is equal to the ratio of signal level present just before application of the quench pulse to the amplitude the oscillations have reached at the end of the quench pulse, controlling the width becomes a convenient method for controlling the gain of the superregenerative device. This is accomplished in FIG. 4 by adding to the radar ranging system an automatic gain control peak detector 80, a binary circuit 82, and a switch 84. Switch 84 has a movable contact 86, stationary contacts 88 and 90, and a control input 92. The operational philosophy of the automatic gain control system is as follows: Periodically, the quench pulse generator is triggered so that the quench pulse occurs during the maximum voltage portion of the received echo. Thus, the output amplitude from the superregenerative device will have no relation to the degree of coincidence between the leading edges of the quench pulse and the echo pulse, but will be dependent purely upon the width of the quench pulse and the strength of the echo. If the echo strength increases, causing an increased output, the width of the quench pulse is accordingly decreased. The converse is also true, thereby providing automatic gain control for the superregenerative device 24.

Specifically, the automatic gain control apparatus for the radar ranging device, as shown in FIG. 4 operates as follows:

The output pulses from timer 10, which are shown by waveform A of FIG. 4B, are applied to a binary circuit 82 which may be conventional JK-type flip-flop. The output of a binary circuit changes its level in response to each timer pulse and this output is illustrated in waveform *b* of FIG. 4B. The magnitude of the binary circuit output is adjusted so that during alternate periods it offsets the ramp voltage into coincidence detector 20 by an amount which corresponds to one-half the duration of the transmitted pulses. Consequently, during these alternate periods, the coincident detector 20 triggers the quench pulse generator 22 at a time substantially corresponding to the receipt of the center portion of the echo signal at antenna 30. Thus, when the quench pulse is applied to the superregenerative oscillator 24 the input signal thereto will be at maximum echo signal strength and the output therefrom will be dependent upon the quench pulse width and the maximum echo signal strength. During these alternate periods, the output from binary circuit 82 also controls movable arm 86 of switch 84 such that the output of superregenerative device 24 is connected to terminal 88. Peak detector 80 detects the output amplitude of the superregenerative device 24 during these alternate periods and provides an output voltage which is proportional to the detected peak amplitude. The latter output voltage is applied to the quench pulse generator 22 to modulate the pulse width of the quench pulse generator output pulses. Many pulse generator circuits are known in the art which provide variable width output pulses that can be controlled by a DC voltage input. Any of these type of devices may be used as a quench pulse generator 22. During the other periods, the output from the binary circuit has no effect on the ramp input to the coincidence detector, and the movable arm 86 of switch 84 is controlled so that it is connected to terminal 90. The only alteration necessary for the bootstrap detector 26 is to provide it with a longer period controlled leakdown so that if the leading edges of the quench pulse and the echo signal have the proper degree of coincidence, the input to the bootstrap detector from the superregenerative device 24 accurately compensates the controlled leakdown which occurs during a period equal to twice the period of the transmitted pulses.

An alternate method for providing automatic gain control is to use the peak detector output signal to change the bias on the tunnel diode so that an echo signal of increasing amplitude would move the quiescent operating point of the tunnel diode away from the valley point and in an increasingly forward biased direction. This would cause a decrease in gain since the resonant circuit of the superregenerative circuit would be more strongly clamped during the quiescent state, and during the sensitive period would not have as great a magnitude of negative resistance.

A modification of FIG. 4 to accomplish the alternate method is illustrated in FIG. 5. The only difference is that the output of peak detector 80 is applied via a resistance 81 to the terminal 60 (FIG. 2) of the superregenerative device 24.

It will be apparent to anyone of ordinary skill in the art that although only range tracking was described for the systems illustrated herein, range searching is necessary prior to range tracking. Range searching can be accomplished, as is well known in the art, by slowing the quench pulse generator in and out of range until a target is detected. This latter feature, of course, is not critical to the present invention.

While the invention has been particularly shown and described with reference to preferred embodiments thereof, it will be understood by those skilled in the art that various changes in form and details may be made therein without departing from the spirit and scope of the invention.

What is claimed is:

1. In a superregenerative circuit of the type having a resonant circuit, an input for connecting radio frequency pulses to said resonant circuit and an output terminal connected to said resonant circuit, the improvement comprising, a. a tunnel diode connected to said resonant circuit,
b. means for biasing said tunnel diode at the valley point of its forward voltage characteristic curve, and
c. means responsive to a pulse applied thereto for shifting the operating point of said tunnel diode to a point on the negative resistance slope of its forward voltage characteristic curve.

2. In a superregenerative circuit of the type having a resonance circuit to which input radiofrequency pulses are applied, a controllable negative resistance device connected to the resonant circuit for causing buildup of oscillations in said tuned circuit when in the negative resistance state, the improvement comprising, a. said controllable negative resistance device being a tunnel diode,
b. biasing means connected to said tunnel diode for biasing said tunnel diode at the valley point of its forward voltage characteristic curve, and
c. pulse receiving means connected to said tunnel diode and said biasing means for overcoming said bias and placing said tunnel diode in the negative resistance region.

* * * * *